(12) United States Patent
Allen et al.

(10) Patent No.: US 10,944,928 B2
(45) Date of Patent: Mar. 9, 2021

(54) ARRAY APPARATUS AND ASSOCIATED METHODS

(71) Applicant: Nokia Technologies Oy, Espoo (FI)

(72) Inventors: Mark Allen, Great Cambourne (GB); Pekka Korpinen, Espoo (FI); Michael Astley, Cambridge (GB); Sami Seppo Kallioinen, Espoo (FI); Aqib Ejaz, Kauniainen (FI)

(73) Assignee: Nokia Technologies Oy, Espoo (FI)

( * ) Notice: Subject to any disclaimer, the term of this patent is extended or adjusted under 35 U.S.C. 154(b) by 73 days.

(21) Appl. No.: 16/301,730

(22) PCT Filed: May 24, 2017

(86) PCT No.: PCT/FI2017/050387
§ 371 (c)(1),
(2) Date: Nov. 14, 2018

(87) PCT Pub. No.: WO2017/203103
PCT Pub. Date: Nov. 30, 2017

(65) Prior Publication Data
US 2019/0182444 A1 Jun. 13, 2019

(30) Foreign Application Priority Data
May 26, 2016 (EP) .................... 16171584

(51) Int. Cl.
*H04N 5/361* (2011.01)
*H04N 5/335* (2011.01)
(Continued)

(52) U.S. Cl.
CPC .......... *H04N 5/361* (2013.01); *H03M 7/3062* (2013.01); *H04N 5/335* (2013.01); *H04N 5/378* (2013.01)

(58) Field of Classification Search
CPC ........ H04N 5/361; H04N 5/335; H04N 5/378; H03M 7/3062
See application file for complete search history.

(56) References Cited

U.S. PATENT DOCUMENTS

| 8,970,740 B2 | 3/2015 | Herman et al. |
| 9,081,731 B2 | 7/2015 | Herman et al. |

(Continued)

FOREIGN PATENT DOCUMENTS

| EP | 2603828 A1 | 6/2013 |
| WO | 2011/071958 A2 | 6/2011 |

(Continued)

OTHER PUBLICATIONS

Konstantatos et al., "Hybrid Graphene-Quantum Dot Phototransistors With Ultrahigh Gain", Nature Nanotechnology, vol. 7, Jun. 2012, pp. 363-368.

(Continued)

*Primary Examiner* — Lin Ye
*Assistant Examiner* — John H Morehead, III
(74) *Attorney, Agent, or Firm* — Harrington & Smith

(57) ABSTRACT

An apparatus comprising a processor and memory including computer program code, the memory and computer program code configured to, with the processor, enable the apparatus at least to: based on a predetermined dark current component for each photodetector in an array of photodetectors, identify a plurality of subsets of photodetectors from the array for signal readout and amplification by a readout circuit, each photodetector of the array configured to provide a photodetector output signal comprising the dark current component and an image component on exposure to incident electromagnetic radiation from a target scene, wherein each subset of photodetectors is identified such that the combined dark current component of the constituent photodetector output (Continued)

signals for each subset is substantially the same; and provide the identified plurality of subsets for use in signal readout and amplification by the readout circuit.

20 Claims, 9 Drawing Sheets

(51) Int. Cl.
*H04N 5/378* (2011.01)
*H03M 7/30* (2006.01)

(56) References Cited

U.S. PATENT DOCUMENTS

| | | | |
|---|---|---|---|
| 2006/0063286 A1* | 3/2006 | Bidermann | H01L 23/544 438/17 |
| 2013/0206959 A1* | 8/2013 | Zhang | H04N 5/361 250/208.1 |
| 2014/0231620 A1 | 8/2014 | Oike et al. | |
| 2016/0173794 A1* | 6/2016 | Beck | H01L 27/14601 348/244 |

FOREIGN PATENT DOCUMENTS

| | | |
|---|---|---|
| WO | 2012/021450 A1 | 2/2012 |
| WO | 2016/003655 A1 | 1/2016 |

OTHER PUBLICATIONS

Romberg, "Imaging via Compressive Sampling", IEEE Signal Processing Magazine, vol. 25, No. 2, Mar. 2008, pp. 14-20.
Huang et al., "Lensless Imaging by Compressive Sensing", IEEE International Conference on Image Processing (ICIP), 2013, 5 pages.
Dadkhah et al., "Compressive Sensing Image Sensors-Hardware Implementation", Sensors, vol. 13, No. 4, 2013, pp. 4961-4978.
Baraniuk et al., "Novel Displays/Imagers: Compressive Sensing Architecture Advances Infrared Camera Design", Laserfocusworld, Jan. 6, 2011, 8 pages.
Xiao et al., "Compressed Sensing Based Apple Image Measurement Matrix Selection", International Journal of Distributed Sensor Networks, vol. 2015, 2015, pp. 1-7.
Jacques et al., "CMOS Compressed Imaging by Random Convolution", IEEE International Conference on Acoustics, Speech and Signal Processing, Apr. 19-24, 2009, pp. 1113-1116.
Extended European Search Report received for corresponding European Patent Application No. 16171584.2, dated Jul. 20, 2016, 7 pages.
International Search Report and Written Opinion received for corresponding Patent Cooperation Treaty Application No. PCT/FI2017/050387, dated Jul. 4, 2017, 11 pages.

\* cited by examiner

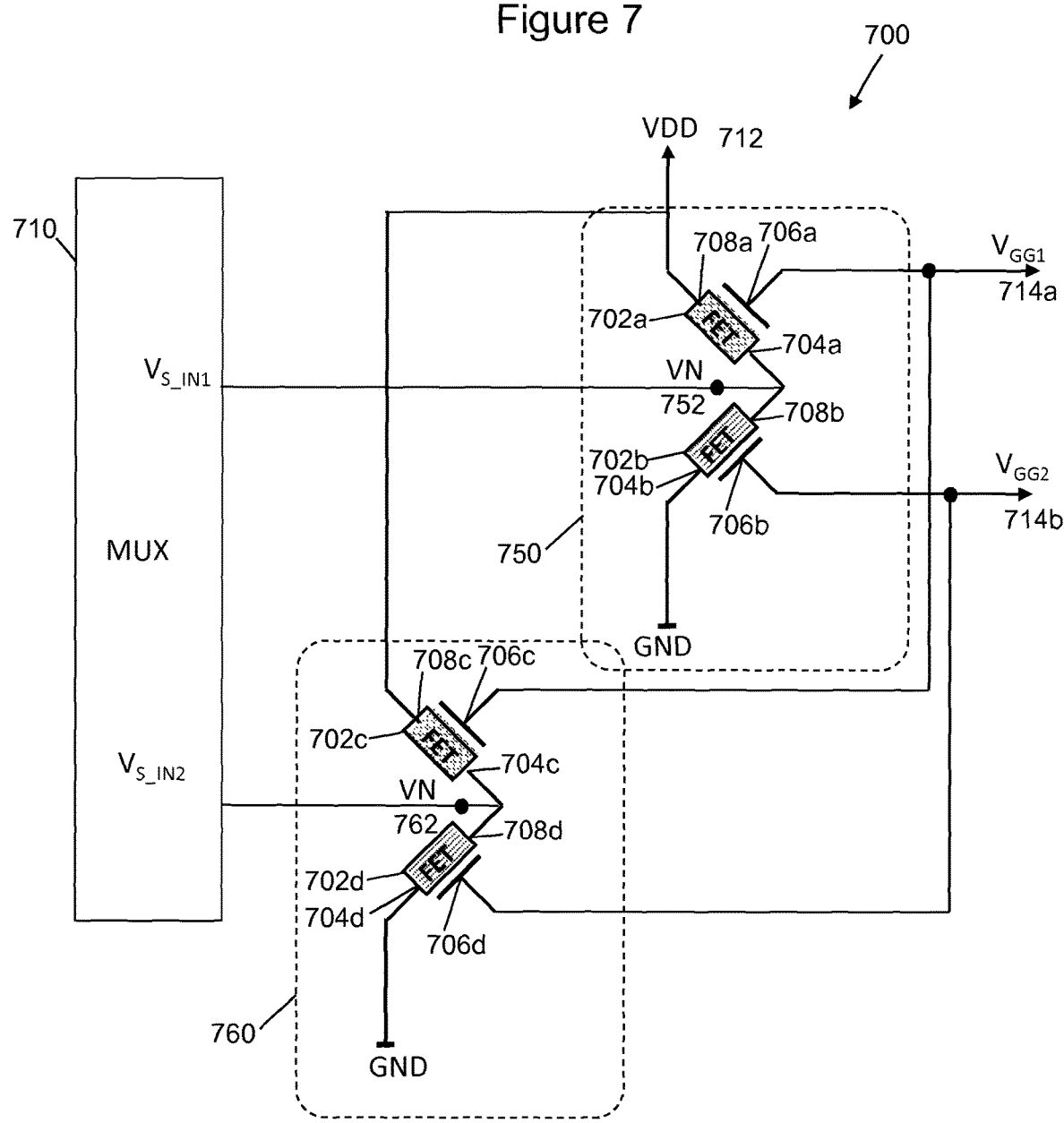

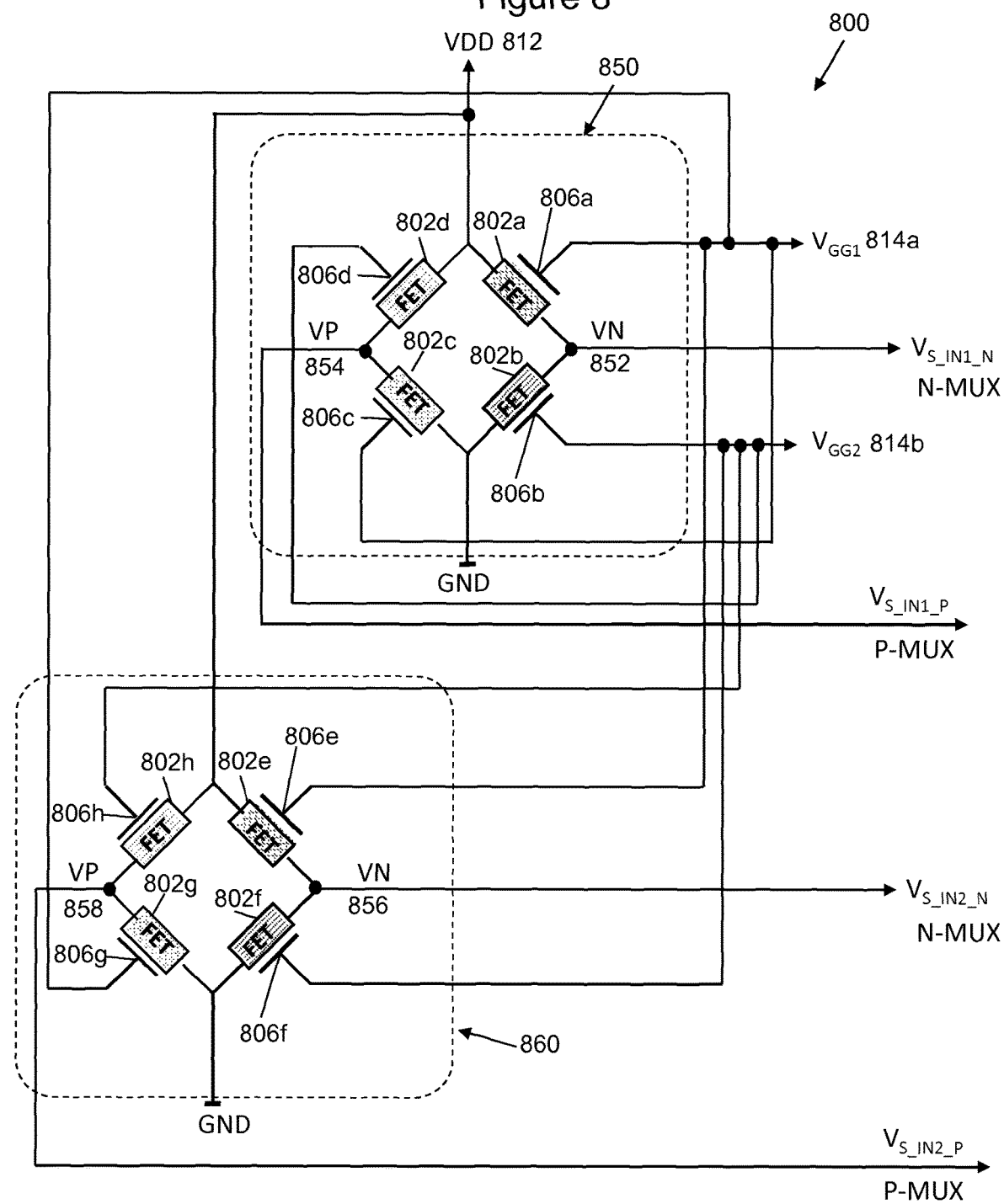

Figure 9

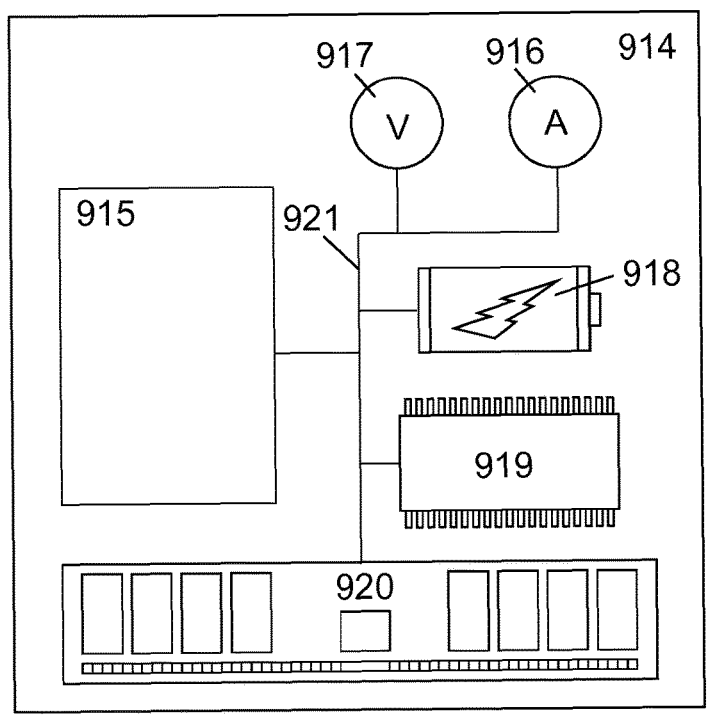

1002
Identifying a plurality of subsets of photodetectors from the array for signal readout and amplification by a readout circuit based on a predetermined dark current component for each photodetector in an array of photodetectors, each photodetector of the array configured to provide a photodetector output signal comprising the dark current component and an image component on exposure to incident electromagnetic radiation from a target scene, wherein each subset of photodetectors is identified such that the combined dark current component of the constituent photodetector output signals for each subset is substantially the same.

1004
Providing the identified plurality of subsets for use in signal readout and amplification by the readout circuit.

ARRAY APPARATUS AND ASSOCIATED METHODS

RELATED APPLICATION

This application was originally filed as PCT Application No. PCT/FI2017/050387 filed May 24, 2017, which claims priority benefit from EP Application No. 16171584.2 filed May 26, 2016.

TECHNICAL FIELD

The present disclosure relates to photodetector arrays, associated methods and apparatus. Certain examples concern an apparatus comprising an array of photodetectors, wherein signal readouts are performed collectively for subsets of photodetectors of the array. Some examples may relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed examples may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop new sensor arrays, such as arrays which can be used as photodetectors.

The listing or discussion of a prior-published document or any background in this specification should not necessarily be taken as an acknowledgement that the document or background is part of the state of the art or is common general knowledge.

SUMMARY

According to a first aspect, there is provided an apparatus comprising a processor and memory including computer program code, the memory and computer program code configured to, with the processor, enable the apparatus at least to:
  based on a predetermined dark current component for each photodetector in an array of photodetectors, identify a plurality of subsets of photodetectors from the array for signal readout and amplification by a readout circuit, each photodetector of the array configured to provide a photodetector output signal comprising the dark current component and an image component on exposure to incident electromagnetic radiation from a target scene,
  wherein each subset of photodetectors is identified such that the combined dark current component of the constituent photodetector output signals for each subset is substantially the same; and
  provide the identified plurality of subsets for use in signal readout and amplification by the readout circuit.

Each subset of photodetectors may be identified such that the combined dark current component of the constituent photodetector output signals for each subset is one of:
  substantially at a predefined level which is matched to a predefined readout circuit offset level; and
  subtracted from a combined photodetector output signal for each subset, the combined photodetector output signal comprising the combined dark current component and a combined image component for each subset, to obtain the combined image component for each subset.

The identification of photodetectors for each subset may be performed using a Bernoulli distribution such that the combined dark current components of the constituent photodetector output signals for the plurality of subsets are substantially the same regardless of the number of photodetectors in each subset.

The number of subsets may be one of: less than the number of photodetectors, and greater than the number of photodetectors in the array. The number of subsets may be less than the number of photodetectors in the array, for example if using a compressive sampling method for imaging the target scene. The number of subsets may be greater than the number of photodetectors in the array, for example if using an oversampling method for imaging the target scene.

The array of photodetectors may form a tile of a plurality of tiles, and each of the plurality of tiles may be coupled to a respective read-out circuit. The apparatus may be configured to provide the respective combined image components for each subset of photodetectors of the tile for subsequent combination with the respective combined image components for each subset of photodetectors of the other tiles to form the image of the target scene.

The apparatus may be configured to provide the respective combined image component for each subset of photodetectors for use in signal read-out and amplification by the readout circuit by controlling a multiplexer according to the identification of photodetectors of that subset. The apparatus may provide the identification of photodetectors of a subset in a form suitable for a multiplexer to use to switch those identified photodetectors into the circuit for measurement, thereby controlling the multiplexer.

The apparatus may comprise the read-out circuit and the read-out circuit may comprise a multiplexer configured to select the photodetectors of each the plurality of subsets of photodetectors according to the identification of photodetectors of each subset for signal read-out and amplification.

The apparatus may comprise the read-out circuit and the read-out circuit may comprise a summer configured to, for each of the plurality of subsets of photodetectors, receive the photodetector output signals from each of the photodetectors of a subset, and sum at least the image components of the received photodetector output signals to provide a combined image component for the subset of photodetectors.

The apparatus may comprise the read-out circuit, and the read-out circuit may comprise an analog-to-digital converter configured to:
  receive at least the combined image components for each of the plurality of subsets of photodetectors;
  convert the received combined image components to a digital combined image component signal, and
  provide the digital combined image component signal, the digital combined image component signal useable to form an image of the target scene.

The apparatus may be configured to:

receive, after signal read-out and amplification, the amplified combined image component for each subset of photodetectors; and process the received amplified combined image component for each subset of photodetectors to form an image of the target scene.

Each subset of photodetectors may comprise one or a plurality of photodetectors.

Each photodetector in the array of photodetectors may comprise:

a channel;

source and drain electrodes configured to enable a flow of electrical current through the channel between the source and drain electrodes; and a photosensitiser configured to generate electron-hole pairs on exposure to incident electromagnetic radiation to produce a detectable change in the electrical current flowing through the channel, the detectable change in electrical current constituting the image component of the photodetector output signal.

The source electrodes of the photodetectors are each connected to respective inputs of the multiplexer to allow readout of the photodetector output signals.

The drain electrodes of the photodetectors are connected in parallel to a common drain voltage source.

Each photodetector may comprise a gate electrode configured to enable the flow of electrical current to be varied, and the gate electrode of each photodetector may be connected in parallel to the gate electrodes of the other photodetectors in the array.

The channel of each photodetector may comprise graphene. The photosensitiser may comprise a plurality of quantum dots. The photodetectors may be arranged to form a one, two or three dimensional array.

The identification of photodetectors for each subset may be one or more of:

stored in a look-up table;

stored in a shift register; and determined dynamically based on the predetermined dark current components of the constituent photodetector output signals.

The photodetectors of the array may be arranged to form one or more of:

a parallel photodetector array configured to provide the photodetector output signals as current signals;

a half-bridge circuit configured to convert the photodetector output signals into a single-ended voltage signal; and a full-bridge circuit configured to convert the photodetector output signals into a differential voltage signal.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, an electromagnetic radiation sensor, an optical imaging device, an infrared imaging device, an X-ray imaging device, a biometric identification device, and a module for one or more of the same.

According to a further aspect, there is provided a method comprising:

identifying a plurality of subsets of photodetectors from the array for signal readout and amplification by a readout circuit based on a predetermined dark current component for each photodetector in an array of photodetectors, each photodetector of the array configured to provide a photodetector output signal comprising the dark current component and an image component on exposure to incident electromagnetic radiation from a target scene, wherein each subset of photodetectors is identified such that the combined dark current component of the constituent photodetector output signals for each subset is substantially the same; and providing the identified plurality of subsets for use in signal readout and amplification by the readout circuit.

The steps of any method disclosed herein do not have to be performed in the exact order disclosed, unless explicitly stated or understood by the skilled person.

In a further aspect there is provided a computer program comprising computer code configured to perform any method claimed or described herein. Corresponding computer programs for implementing one or more steps of the methods disclosed herein are also within the present disclosure and are encompassed by one or more of the described examples.

One or more of the computer programs may, when run on a computer, cause the computer to configure any apparatus, including a battery, circuit, controller, or device disclosed herein or perform any method disclosed herein. One or more of the computer programs may be software implementations, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

One or more of the computer programs may be provided on a computer readable medium, which may be a physical computer readable medium such as a disc or a memory device, or may be embodied as a transient signal. Such a transient signal may be a network download, including an internet download.

The present disclosure includes one or more corresponding aspects, examples or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

FIG. 7 shows a half bridge array of photodetectors according to examples described herein;

FIG. 8 shows a full bridge array of photodetectors according to examples described herein;

FIG. 9 shows an apparatus according to examples described herein;

FIG. 10 shows a method according to examples described herein; and

Figure 1:
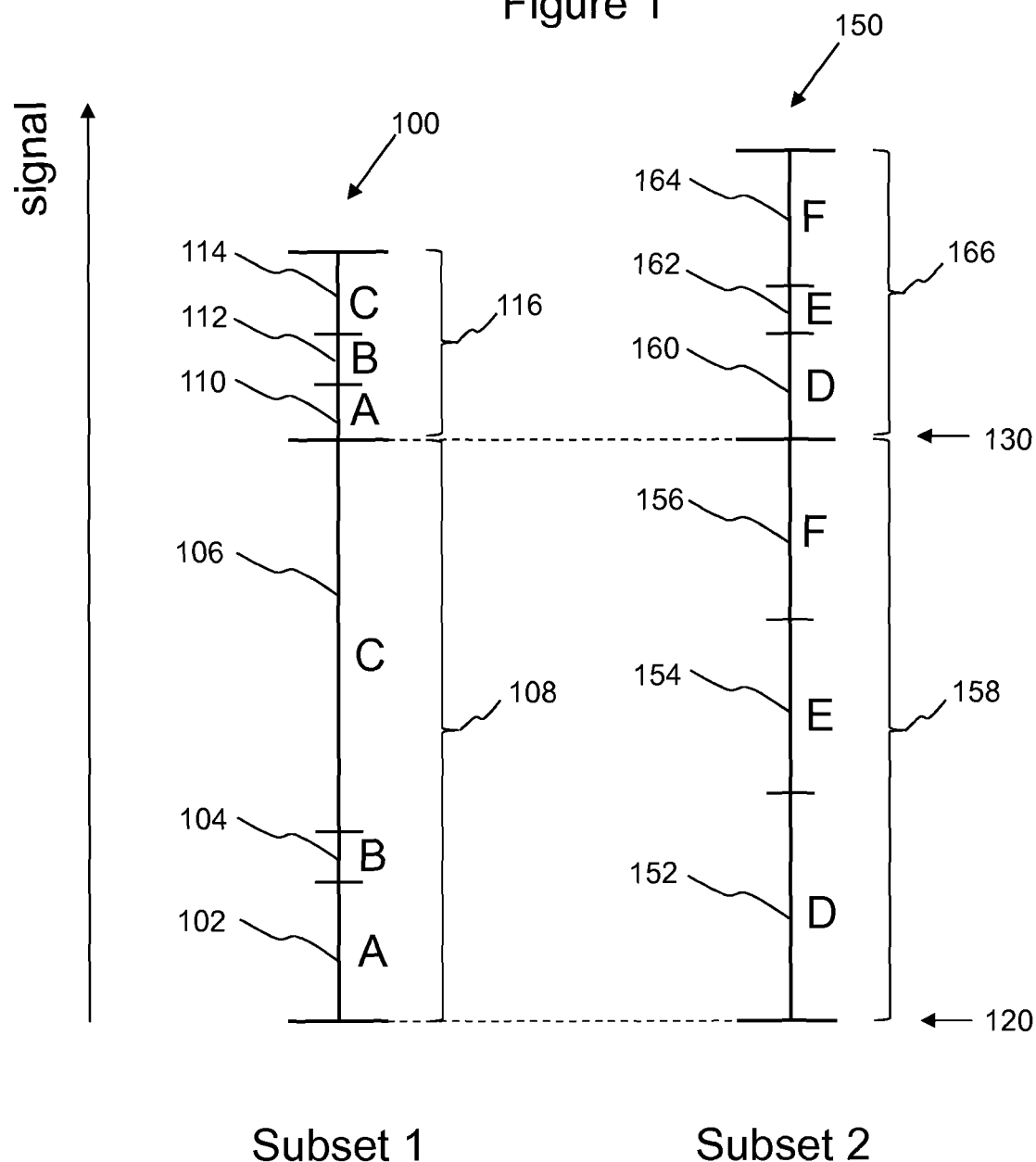
FIG. 1 shows a plurality of combined photodetector output signals according to examples described herein.

DESCRIPTION OF SPECIFIC
ASPECTS/EXAMPLES

Certain examples described herein relate to photosensor arrays. In such arrays the sensing may, for example, be performed using field-effect transistors (FETs). For example, a photodetector array may be realised using an array of quantum-dot graphene FETs (QD GFETs). QD GFET arrays typically exhibit large variations in resistance between the individual QD GFETs in the array, due to variations in carrier charge density within the graphene channel, impurities, and variations in contact resistance for example. Thus generally it may be challenging to realize a large GFET array with small spread in resistance of individual QD GFETs in the array around the nominal value.

Certain examples described here may provide a photodetector array (e.g., a QD GFET photodetector array), which performs data acquisition based on the concept of compressed sensing. In compressive sensing (also called compressive sampling or compressive imaging) a group of photodetectors is switched in together for a single measurement, and subsequent measurements are then recorded for different groups of photodetectors. In this way, for example for a 100 photodetector array, 10 measurements each using a group of photodetectors may be taken achieving a 10% compression rate (in contrast to 100 measurements being taken if measuring each photodetector once individually). That is, instead of measuring each photodetector output signal individually (from an array of N photodetectors), the combined output from a certain combination of photodetectors connected in parallel may be measured at once, and several of these measurements may be carried out for different combinations of parallel connected photodetectors. The photodetector output signals recorded for two or more photodetectors in a subset can then be superimposed. Taking only one such measurement from a subset of photodetectors obviously will not allow differentiation of the signals from the individual photodetectors which are measured simultaneously, but an image can be reconstructed from a number of successive measurements from subsets of photodetectors. Throughout this document, a photodetector may also be called a pixel.

Compressive sensing may be performed at various levels of compression. For example, if taking 10 measurements for an array of 100 photodetectors, this may be termed a 10% compression. Compression of less than 5%, 5%, 10%, 20%, 30%, 40%, 50%, 60%, 70%, 80%, 90%, and more than 90% may be used, for example. A compression of 20% to 30% may provide a good balance between economy of measurement (i.e. taking as few measurements as possible) and acceptable resultant image quality (i.e. ensuring enough data is recorded).

Imaging in an oversampling regime may be performed. For example if 200 measurements are taken from an array of 100 photodetectors this may be termed a 200% compression/oversampling. Oversampling may be done at 100%, 150%, 200%, 250%, 300% and more than 300%, for example.

Oversampling in this way may provide a more flexible way of averaging the readings from individual photodetectors. For example, if measuring one photodetector at a time, for an array of 100 photodetectors, 100, 200, 300 or other multiples of 100 measurements may be recorded. However, by measuring as described herein, for example a 150% oversampling ratio may be made, which may be considered equivalent to measuring each individual photodetector 1.5 times (which of course is not possible by measuring individual photodetectors since only a whole number of individual photodetector readings may be taken).

In a compressive sensing measurement regime, the required number of measurements (M) is less than the number of photodetectors (N). Hence, image compression can be achieved "on the fly". Imagine recovery from data recorded using compressive sensing is based on the recorded image being treated as an underdetermined system, and mathematical methods for handling sparse systems of data, such as L1 minimisation of the total variation, may be used to recover/reconstruct the image. Further, the signal to noise ratio of images obtained using methods described herein may be better/higher than for individually measured photodetectors as described below.

A sensing matrix may be used to record which photodetectors of the array are identified for switching into the circuit for each measurement. In such a sensing matrix each matrix entry in a row may represent a photodetector, so each row represents a subset of photodetectors to be used together to measure a combined photodetector output signal, and each column represents a particular photodetector (and for example, a '1' may represent switching the photodetector into the circuit while a '0' may represent not using that photodetector by not switching it into the circuit). The number of rows represents the number of different measurements which are to be taken. A plurality of photodetectors may be switched in as a subset of the total number of available photodetectors for each measurement.

In certain examples described herein, photodetectors may be selected in such a way that the total acquired signal level for each successive measurement is always at an optimal level for the front-end electronics. For example, photodetectors may be selected for each measurement which provide substantially the same combined offset current per measurement, so that the offset current for each measurement taken using the subset of photodetectors can readily be discarded/ignored and the remaining acquired signal, relating to the image being captured, can be provided for further processing to obtain a resultant image. The offset current may be a dark current measurement taken for each photodetector without illuminating the photodetector.

Example apparatus described herein may be configured to, based on a predetermined dark current component for each photodetector in an array of photodetectors, identify a plurality of subsets of photodetectors from the array for signal readout and amplification by a readout circuit. Each photodetector of the array is configured to provide a photodetector output signal comprising the dark current component and an image component on exposure to incident electromagnetic radiation from a target scene. Each subset of photodetectors is identified such that the combined dark current component of the constituent photodetector output signals for each subset is substantially the same. The apparatus may then provide the identified plurality of subsets for use in signal readout and amplification by the readout circuit.

FIG. 1 shows an example of first and second signals 100, 150. Each signal 100, 150 may be called a combined photodetector output signal because each shows the total output from a subset of photodetectors. Combined photodetector output signal 100 comprises photodetector output signals from three photodetectors labelled A, B and C. The dark current component of photodetector A 102, the dark current component of photodetector B 104, and the dark current component of photodetector C 106 together provide the combined dark current component 108 of the first combined photodetector output signal 100. The image component of photodetector A 110, the image component of photodetector B 112, and the image component of photodetector C 114 together provide the combined image component 116 of the first combined photodetector output signal 100.

Similarly, second combined photodetector output signal 150 comprises photodetector output signals from three photodetectors labelled D, E and F. The dark current component of photodetector D 152, the dark current component of photodetector E 154, and the dark current component of photodetector F 156 together provide the combined dark current component 158 of the second combined photodetector output signal 150. The image component of photodetector D 160, the image component of photodetector E 162, and the image component of photodetector F 164 together provide the combined image component 166 of the second combined photodetector output signal 150.

In some examples, each subset of photodetectors (A, B, C; D, E, F) may be identified such that the combined dark current component 108, 158 of the constituent photodetector output signals for each subset is substantially at a predefined level 130 which is matched to a predefined readout circuit offset level. For example, the combined dark current components for subset 1 and subset 2 in this example are at a signal level indicated by the arrow 130. A readout circuit configured to receive the measured photodetector signals may comprise components or modules which are set to have an offset current applied which is of the same offset current level 130 as that of each photodetector subset. Thus the combined dark current offset of the subsets of photodetectors are matched to an offset applied to the read-out electronics. In this way the combined dark current offset may be ignored/disregarded for each subset measurement. The offset applied to the readout circuit component(s) can be set at a single value (signal level 130) for all measurements because the photodetectors identified for combination as a subset are so identified to provide a combined dark current level matching that offset 130. This may not be possible if individual photodetectors were selected for measurement because the dark currents of the individual photodetectors may differ from one another and it would not be straightforward to subtract the different dark current levels for each measurement.

In some examples, each subset of photodetectors (A, B, C; D, E, F) may be identified such that the combined dark current component 108, 158 of the constituent photodetector output signals for each subset is subtracted from a combined photodetector output signal 100, 150 for each subset (the combined photodetector output signal 100, 150 comprises the combined dark current component 108, 158 and a combined image component 116, 166 for each subset). Thus the combined image component 116, 166 for each subset is obtained without a dark current component present. The combined image components 116, 166 may then be provided for further processing without a dark current component also being present. Any downstream electronics then may be configured to process the combined image components 116, 166 without also needing to be configured to process the combined dark currents 108, 158.

Both methods described above allow for any signal variations which are due to dark current variations (i.e. due to resistance variations) between photodetectors to be disregarded in later processing of the recorded photodetector output signals by setting the combined dark currents to be substantially the same for each reading. This means that any amplifier components in the read-out electronics (or indeed any other components having a particular operating range) may be used so that the operating range of the component may be used for receiving and processing the image signal components and does not have to also cope with variations in signal due to dark current offsets from the measured signals. In some examples the dark current signals may be much larger than the image component signals, and/or may vary over a large range (for example, over a much larger range than the range of image component signals). Such large dark current signal components and widely varying dark current signal components may arise when using QD GFETs as photodetectors, for example, in which the resistances of each QD GFET may be very different from one another, hence giving very different dark current readings.

The first and second image components 116, 166 vary in signal level, dependent on what image signals are being recorded because recording light from different portions of the target scene using the different combinations of photodetectors may provide different signal levels. In a real-world example the dark current component of a photodetector output signal may be much larger, for example by an order of magnitude than the image component of the photodetector output signal (this may be the case where the photodetectors are QD GFETs, for example). It may, for example, be the case that an offset/dark current of 100 µA is measured from a photodetector which also measures a signal current of 10 µA. Similarly the combined dark current component of a combined photodetector output signal may be much larger than the combined image components of the photodetector output signal.

The dark currents of each photodetector A-F may each be very different (for example, the dark current of photodetector C 106 is much greater than that of photodetectors A-F 102, 104, 152, 142, 156) and the dark currents of each photodetector in a group may be very different (that is, the dark current component of photodetector C 106 is much greater than the dark currents of photodetectors A or B 102, 104). The dark currents of each photodetector A-F may each be similar to each other (for example, the dark currents of photodetectors D, E and F 152, 154, 156 are substantially the same). The important factor is that the collective dark current components 108, 158 is substantially the same for each subset of photodetectors. The first and second combined dark current components 108, 158 are substantially the same, as shown by the dark current signal level 130 measured from the signal baseline 120.

Figure 2A:
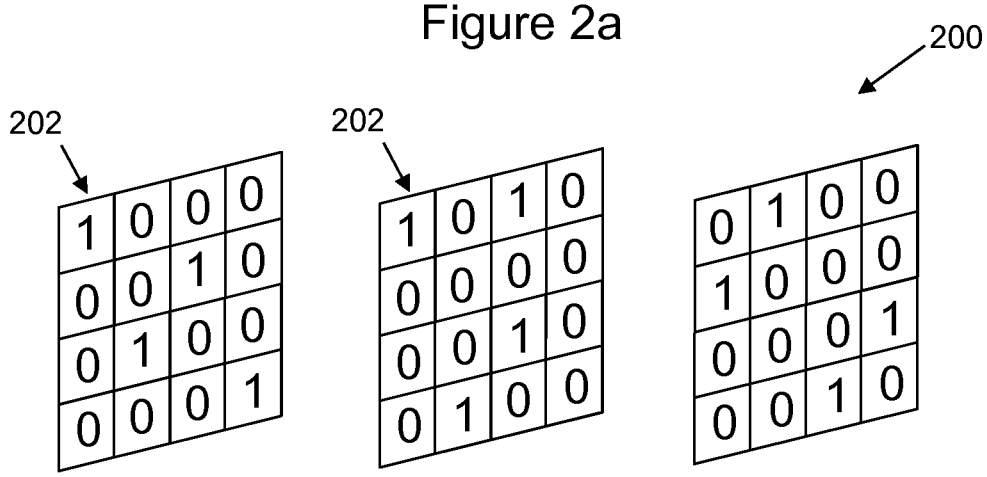
FIGS. 2a and 2b show Bernoulli distribution selections of a plurality of photodetectors according to examples described herein.
Figure 2B:
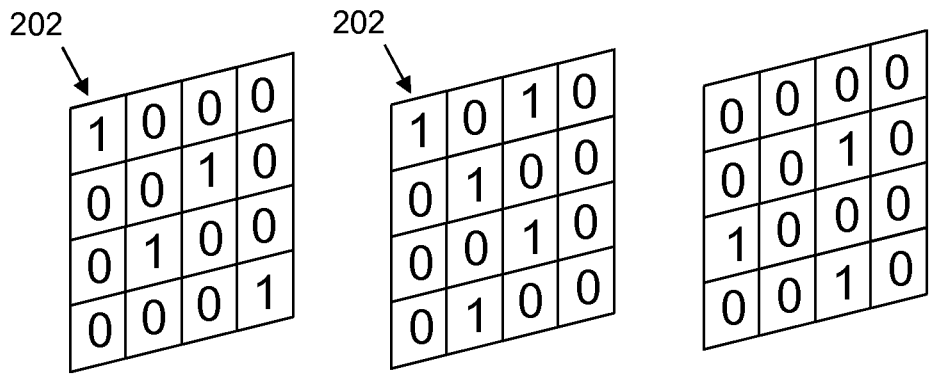

FIGS. 2a and 2b schematically illustrate three subsets of photodetectors 200, 250 which may be identified for inclusion together as a subset according to examples described herein. The schematic array of 16 photodetectors is illustrated as a grid. A '1' in a grid square indicates that the photodetector of the grid square is used for measurement. A '0' in a grid square indicates that the photodetector of the grid square is not used for measurement. Each subset of photodetectors may comprise one or a plurality of photodetectors (in this example, a plurality is shown).

In some examples, the identification of photodetectors for each subset may be performed using a Bernoulli distribution such that the combined dark current components of the constituent photodetector output signals for the plurality of subsets are substantially the same regardless of the number of photodetectors in each subset. A Bernoulli distribution is the probability distribution of a random variable which takes the value 1 with success probability of p and the value 0 with failure probability of q=1−p. It can, for example, be used to represent a coin toss where 1 and 0 would represent "head" and "tail" (or vice versa), respectively. The Bernoulli distribution may be recorded as a sensing matrix 210, 260 as shown in FIGS. 2a and 2b, wherein each row identifies whether, for one subset, each photodetector is identified to be on ('1') or off ('0'), and each row corresponds to a subset for a measurement.

In FIG. 2a, the same number of photodetectors (four) is used for measurement in each subset (i.e. for each measurement). The overall combined dark current of the four photodetectors selected to form each subset of photodetectors will be substantially the same for each subset 1-3. In this example, each row of the sensing matrix 210 has the same number of zeros and ones as all the other rows (in this example, four '1's and 12 '0's). In other examples, such as that of FIG. 2b, each row of the sensing matrix has an unequal number of zeros and ones.

The overall combined dark current component for a subset of photodetectors may have a smaller variation between subsets/measurements than the dark current components for individual photodetectors by virtue of identifying photodetectors to include in subsets of photodetectors wherein each subset has substantially the same combined dark current component. Therefore, the average offset signal level (dark current level) for each measurement from a subset of photodetectors will be substantially the same. Measuring signal outputs in this way allows the dynamic range of the downstream readout circuitry (such as an analog to digital converter (ADC)), to be used to handle the image components of photodetector output signals and not be limited by having to handle variations photodetector output signals due to photodetector/photodetector dark current levels which, as they are the same for each measurement, can be disregarded.

In FIG. 2b, the number of photodetectors/photodetectors in each subset varies, but the overall combined dark current component for each subset will be substantially the same for each subset. In subset 1 four photodetectors are used for a first measurement, in subset 2 five photodetectors are used for a second measurement, and in subset 3 three photodetectors are used for a third measurement.

Therefore in certain examples such as that of FIG. 2b, the sensing matrix may be defined so that the mean value of the Bernoulli distribution is selected dynamically. In this way the number of photodetectors combined in each measurement may not be a fixed number, but may be chosen so that the total combined photodetector signal level is always matched to the readout circuit components. In other words, different numbers of photodetectors may be grouped into subsets provided each subset exhibits substantially the same combined dark current output signal component. Matching the signal readout to the readout electronics reduces the need for programmable gain stages in the analog front end part of the readout circuit because variations between readings due to dark current variations are substantially eliminated.

In order to identify photodetectors to group into subsets which have the same combined dark current components, it may be necessary to measure the offset level (i.e. background or "dark current level") of each photodetector prior to carrying out the sequence of measurements. For this pre-measurement, the sensing matrix can simply be the identity matrix. In other examples, just prior to each reading, a pre-reading may be recorded and a feedback circuit used to fine-tune which photodetectors will be included in a particular subset.

In certain examples, it may be that the photodetectors identified to be grouped into a subset are selected based on both the combined dark current component for the subset and the combined image component for the subset. This may be achieved by pre-measuring the dark currents for each photodetector in the array, and taking image measurements using subsets of photodetectors having a particular combined dark current component until the combined image component for a subset is within a predefined target image component signal range. In this way variations in dark current may be removed from processing (due to all subsets of photodetectors having substantially the same combined dark current values) which allows the dynamic range of the readout electronics to be used only for processing the image components, and the combined image component lies within a target image component signal range (which may be, for example, the operating range, or an operating range having a particular sensitivity/accuracy, of the readout electronics). For example, there may be 50 subsets of photodetectors which all provide the same combined dark current component, but of these 40 subsets provide a combined image signal component within a particular signal range with the remaining ten subsets providing a combined image signal component outside the particular signal range. The ten subsets may not be used to record signals for downstream processing because the other 40 subsets can all provide a combined image signal component within a particular range (e.g. the dynamic range of an ADC in the readout circuit).

In some examples, the identification of photodetectors for each subset (for example, recorded as a sensing matrix) may be stored in a look-up table (LUT). A LUT may be implemented in an application-specific integrated circuit (ASIC), which may require $N^2$ storage elements (wherein N is the number of photodetectors in the array). The additional area cost of the LUT may dominate the digital part of the read out circuit.

In some examples, the identification of photodetectors for each subset may be stored in a shift register such as a linear feedback shift register (LFSR). A LFSR requires N storage elements for holding the initial seed and a maximum of N gates to implement the feedback loop. Hence, the additional area cost of using a LFSR as opposed to a LUT recorded using an ASIC may be significantly smaller.

In some examples, the identification of photodetectors for each subset may be determined dynamically based on the predetermined dark current components of the constituent photodetector output signals as described above. This may be implemented by delivering each row of the sensing matrix as a vector in real time for each measurement to control circuitry configured to switch in the identified photodetectors (for example, by using a multiplexer or analog switch bank).

Of course the examples of FIGS. 1, 2a and 2b are schematic and in practice there may be tens or hundreds (and possibly more) photodetectors per subset depending on the size of the photodetector array. In some examples, different subsets may comprise one or more of the same photodetectors in the array (such as photodetector 202 in subsets 1 and 2 of FIGS. 2a and 2b). In other examples there may not be any overlap so that each subset has a unique subset of photodetectors which are not included in any other subsets.

Figure 3:
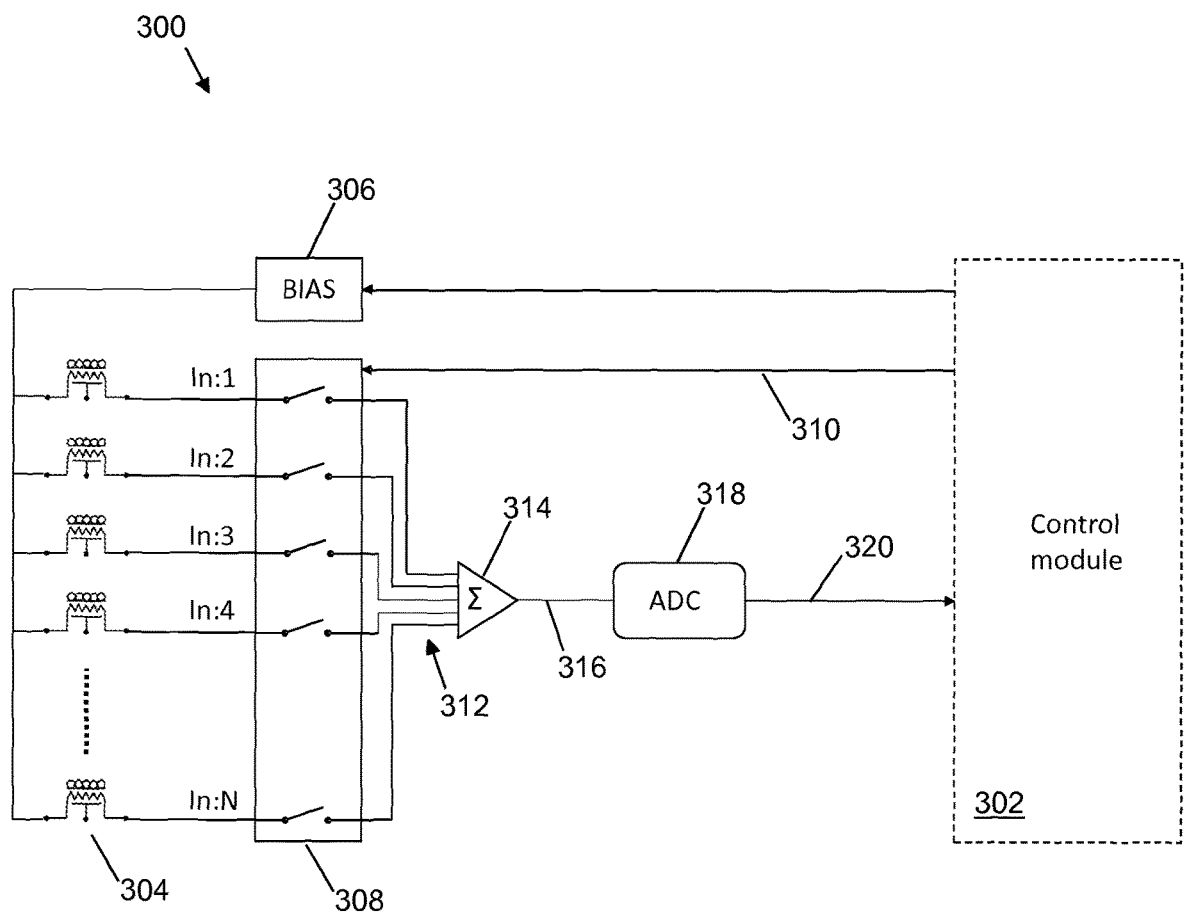
FIG. 3 shows an apparatus according to examples described herein.

An example apparatus 300, 302 according to examples described herein is illustrated in FIG. 3. In some examples the control module 302 may be the apparatus or may comprise the apparatus. In some examples the control module 302 plus one or more other illustrated circuit elements may be the apparatus.

Apparatus 300 comprises a control module 302 and a parallel array of photodetectors 304 (in this example the photodetectors are field-effect-transistors, FETs). The control module can send a bias signal 306 to the photodetectors to enable the photodetectors for measurement once the photodetectors are switched into the circuit. Each photodetector 304 can be connected into the circuit for signal read-out using a multiplexer (an analog switch bank) 308. The control module 302 can send a signal 310 to the multiplexer 308 with the identity of the photodetectors 304 in a subset which are to be switched in for a signal measurement and readout. Thus the apparatus 300, 302 may be configured to provide the respective combined image component for each subset of photodetectors 304 for use in signal read-out and amplification by the readout circuit by controlling a multiplexer 308 according to the identification of photodetectors 304 of that subset. The apparatus may provide the identification of photodetectors in a form suitable for a multiplexer to use to switch the identified photodetectors into the circuit. The apparatus in some examples may comprise the read-out circuit (for example, the readout circuit may comprise the control module 302, ADC 318, summer 314 and multiplexer 308). Therefore in certain examples the read-out circuit comprises a multiplexer 308 configured to select the photodetectors of each the plurality of subsets of photodetectors 304 according to the identification of photodetectors of each subset for signal read-out and amplification.

Those photodetectors 304 identified as a subset in the control signal 310 can be switched in by the multiplexer 308 and the resulting photodetector output signals 312 may be summed by a summer 314. Therefore in certain examples the read-out circuit comprises a summer 314 configured to, for each of the plurality of subsets of photodetectors 304, receive the photodetector output signals 312 from each of the photodetectors 304 of a subset, and sum at least the image components of the received photodetector output signals 312 to provide a combined image component 316 for the subset of photodetectors.

In some examples the readout circuitry downstream from the summer 314 (e.g., the ADC 318 and control module 302) may have a matching offset current applied to it which matches the known combined dark current from the combined photodetector output signal 316. In some examples the photodetector output signals 312 may be summed using a summer 314 and the combined photodetector output signal from the summer 314 may have the known combined dark current component subtracted from it to leave the combined image component for processing e.g., by the ADC 318 and control module 302. In some examples the individual known dark currents from the individual photodetectors 304 may each be subtracted from the individual photodetector output signals 312 so that the image component without the dark current component for each photodetector in a subset is passed to the summer 314 for summing to obtain the combined image component.

The combined photodetector output signal 316 (or in some examples the combined image components for the subset) is passed to an ADC 318 which converts the received signal to a digital signal 320 for downstream processing, for example by the control module 320 or by another apparatus/module (not shown) to obtain a resulting image.

That is, the read-out circuit may comprise an analog-to-digital converter (ADC) 318 configured to receive at least the combined image components 316 for each of the plurality of subsets of photodetectors 304, convert the received combined image components 316 to a digital combined image component signal 320, and provide the digital combined image component signal 320, the digital combined image component signal 320 useable to form an image of the target scene. The ADC 318 may comprise an amplifier configured to amplify the combined photodetector output signal 316.

The apparatus 300, 302 may be configured to receive, after signal read-out and amplification, the amplified combined image component 320 for each subset of photodetectors 304, and process the received amplified combined image component 320 for each subset of photodetectors 304 to form an image of the target scene.

An example measuring sequence using the apparatus 300 is FIG. 3 is as follows:

1. A bias voltage 306 is applied to the photodetectors 304 (and in this example of the photodetectors being field-effect transistors, a gate voltage is applied to the gate of each photodetector, not shown in FIG. 3. All switches in the multiplexer 308 are open so no current (or only a trickle current) is flowing through the photodetectors 304.

2. The first row of the sensing matrix, which provides the identity of the first subset of photodetectors 304 to be used for a combined measurement, is provided 310 to the multiplexer 308. The sensing matrix may be stored on "on-chip hardware" (e.g., a look-up table or linear feedback shift register) of the apparatus 300, 302.

3. The corresponding switching transistors in the multiplexer 308 are switched on for a specified "exposure time" (e.g. 10 μs).

4. The photodetector output signals 312 are combined 314 and the combined photodetector output signal 316 is amplified and converted at the ADC 318.

5. "On-chip hardware" provides the identity of the second subset of photodetectors 304 (i.e. the next row of the sensing matrix) to the multiplexer 308.

6. Steps 2-5 are carried out for a number of measurements (which can be significantly less than the number of QD GFET photodetectors in a compressive sensing type measurement).

7. The bias voltage and gate voltages are switched off.

8. An image is formed from the combined image components of the combined photodetector output signals (for example, by reconstructing the image using L1 minimisation of the total variation from the received combined image signals).

Image reconstruction from the obtained combined image component signals may be performed using methods for processing mathematically sparse data. Greedy algorithms including thresholding based methods (e.g., orthogonal matching pursuit algorithm (OMP), Compressive Sampling Matching Pursuit Algorithm (CoSaMP), or iterative hard thresholding algorithm (IHT)) may be used in some examples. Methods based on convex optimization (such as L1 minimization) may be used in some examples. A main difference between optimization based methods and greedy methods is that optimization based methods may generally give a superior performance, but at a higher computational cost.

A difference between an overdetermined system (that is, one in which more measurements are taken than the number of photodetectors) and an underdetermined system (that is, one in which fewer measurements are taken than the number of photodetectors) is that an overdetermined system may allow (if it is full rank) unambiguous recovery of all kinds of signals, while an underdetermined system may allow the recovery of sparse/compressed signals. For overdetermined systems one can use, for example, ordinary least squares algorithms to recover any signal. But if the signal of interest is sparse, as in an underdetermined system, then greedy algorithms and/or L1 minimisation algorithms may be used (these may be used in both over- and under-determined cases). Other signal recovery methods (e.g. focal underdetermined system solution (FOCUSS) algorithm, iterative reweighted L2/L1 algorithm, sparse Bayesian learning algorithm) are possible, which fall into the categories of greedy methods or optimization-based methods.

Figure 4:
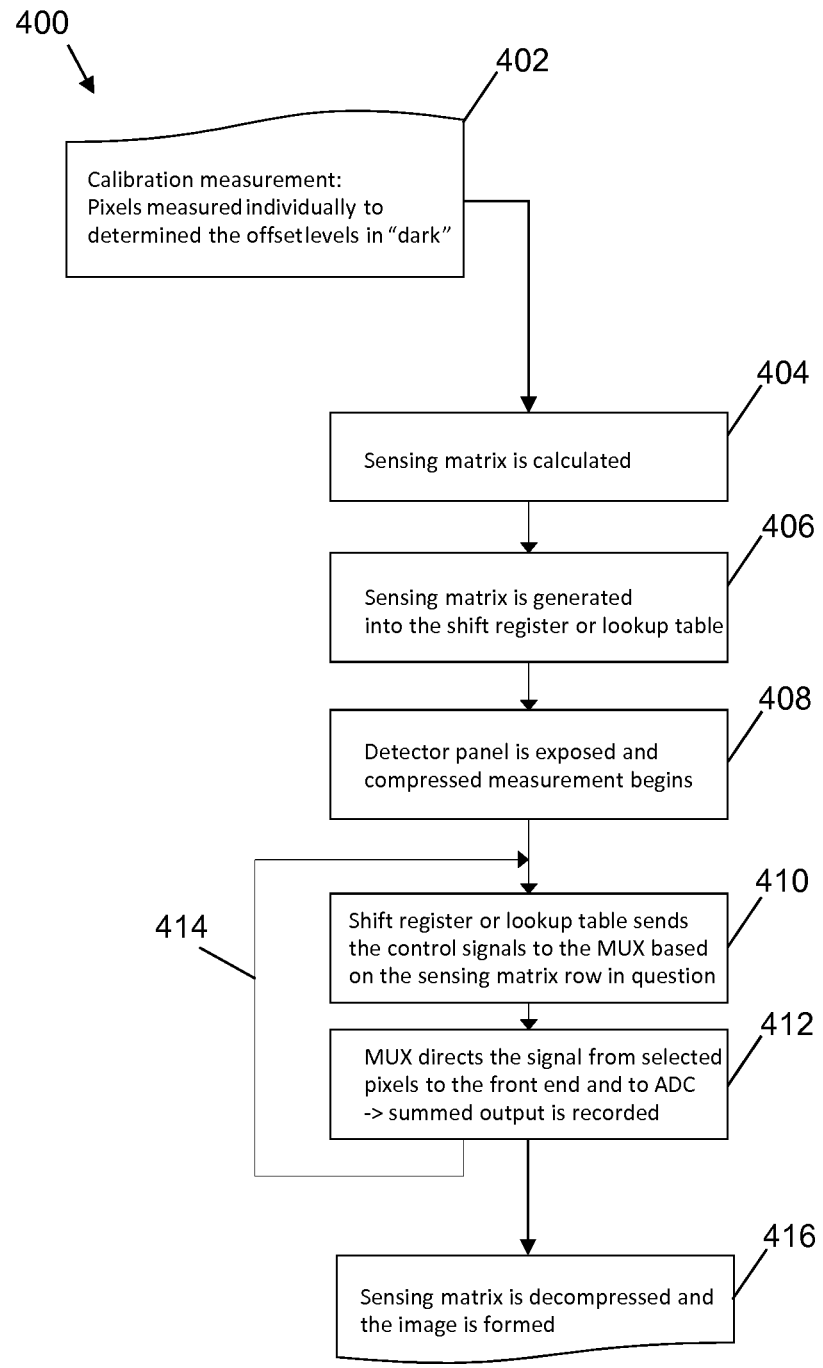
FIG. 4 shows a method according to examples described herein.

FIG. 4 illustrates an example method 400 using apparatus as described herein. At step 402 a calibration measurement is taken to determine the dark current/offset levels of each photodetector/photodetector individually. At step 404 the sensing matrix is calculated. The identity of the photodetectors of each subset of the plurality are determined at this step 404, based on the dark current calibration measurements taken at step 402, so that each subset of photodetectors provides substantially the same combined dark current as other subsets.

At step 406 the sensing matrix is generated and stored, for example in a look-up table or shift register. At step 408 the detector panel is exposed (that is the array of photodetectors are exposed to the target scene to be imaged) and measurement begins.

At step 410, the identity of the photodetectors to be used in each subset are identified to the multiplexer as control signals to control switching in the photodetectors of each subset. Each row of the sensing matrix provides the identity of a subset of photodetectors as determined in step 404. In step 412 the multiplexer directs the photodetector output signals from the selected photodetectors to the front-end electronics and ADC, and a summed/combined output signal is recorded for that subset. This process of steps 410 and 412 is repeated 414 for the number of subsets to be used (i.e. the number of rows of the sensing matrix). After recording the output from each subset of photodetectors, the sensing matrix is decompressed (that is, the recorded measurements are processed to obtain an image of the target scene from the measurements taken in the "compressive sensing" regime by which fewer measurements are taken than the number of photodetectors in the array).

Figure 5:
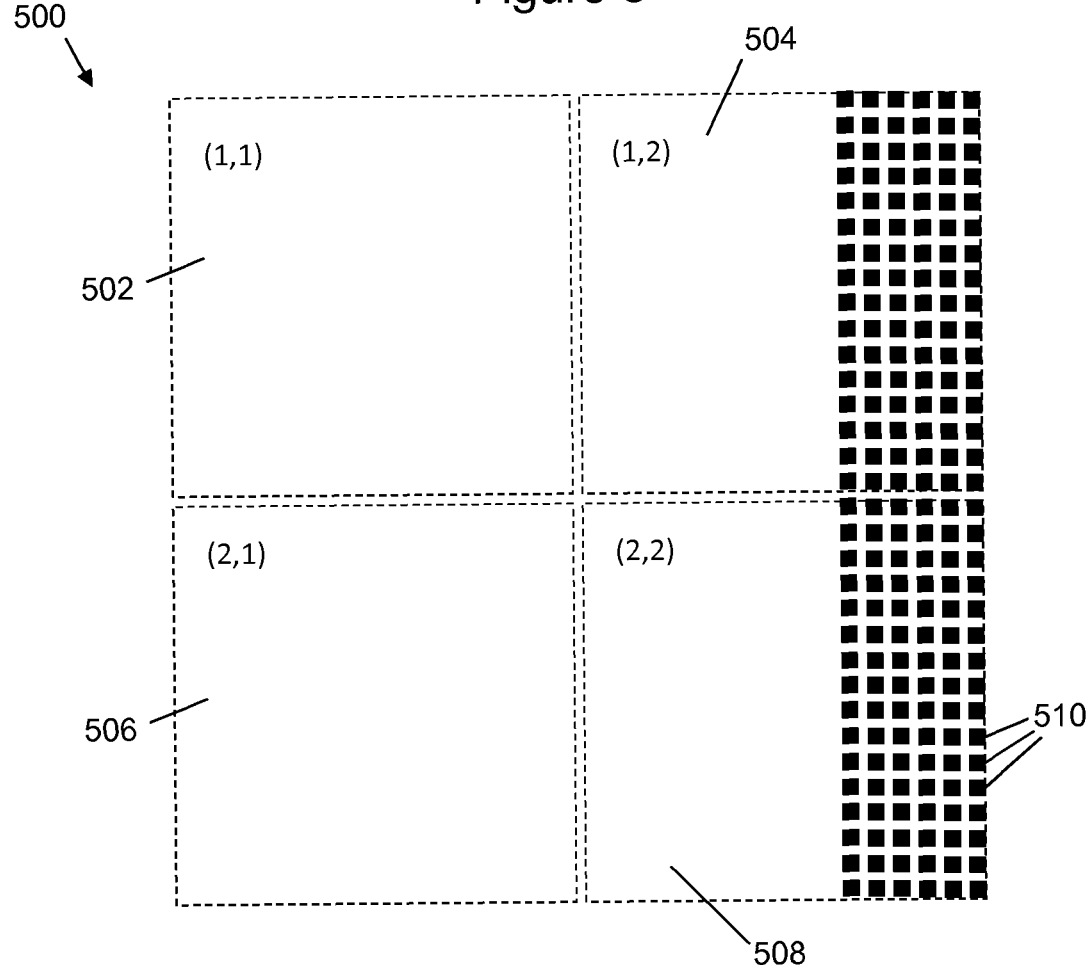
FIG. 5 shows a plurality of photodetector array tiles according to examples described herein.

In certain examples the plurality of photodetectors in the array may be organised into a plurality of tiles, (sub-regions of the photodetector array). FIG. 5 shows an array of photodetectors 500 which is split into four tiles 502, 504, 506, 508, each tile comprising a plurality of photodetectors 510. Thus a complete imaging panel 500 may be constructed from a number of imaging "tiles", where each tile comprises a set number (e.g. 256) of individually addressable photodetectors 510 (of course in other examples more or fewer tiles, and more or fewer photodetectors per tile, may be used).

In other words, the array of photodetectors 510 may form a tile 502, 504, 506, 508 of a plurality of tiles 502, 504, 506, 508, and each of the plurality of tiles 502, 504, 506, 508 may be coupled to a respective read-out circuit (not shown). The apparatus may be configured to provide the respective combined image components for each subset of photodetectors of the tile for subsequent combination with the respective combined image components for each subset of photodetectors of the other tiles to form the image of the target scene.

In certain examples, an image from each tile may be formed using the combined image components obtained for photodetectors of each tile, and the resultant images from all tiles may be combined to obtain a resultant overall image. In certain examples, the respective combined image components from each tile may be combined with the combined image components from the other tiles to obtain a resultant image for the array. By arranging the photodetectors into arrays of tiles, each tile associated with its own dedicated read out circuitry, the system may be easily scaled up by including more tiles.

The size of the photodetector sub-array tiles may be chosen to provide an optimum number of photodetectors (N) for measurements according the examples disclosed herein in terms of memory requirements. That is, there may be a trade-off between a large enough number of photodetectors per tile to obtain a good image quality and a small enough number of photodetectors per tile so that the sensing matrix for that tile can be stored on a realisable ASIC and that the data obtained from that tile is a manageable/readily processable size, for example. Another factor to consider is the power consumption, which increases with the number of photodetectors measured in parallel. As an example, there may be between a minimum of 30 and a maximum of 1000 photodetectors per tile, for example between 100 and 300 photodetectors per tile. In such an arrangement, between 10 and 50 photodetectors may be measured simultaneously, for example.

In some examples, the number of subsets of photodetectors may be less than the number of photodetectors. This may be termed a compressive sensing or compressive sampling configuration because fewer measurements are recorded than there are photodetectors/photodetectors in the array.

In some examples, the number of subsets of photodetectors may be greater than the number of photodetectors in the array. This may be termed an oversampling configuration (i.e. it may be represented by an overdetermined system of equations).

The signal to noise ratio (SNR) of captured image data depends on how many measurements are taken in total (i.e. the number of rows in the sensing matrix). If a larger number of measurements are taken than the number of photodetectors in the array this can lead to a better SNR than would be achieved if each of the photodetectors were measured individually.

Figure 6:
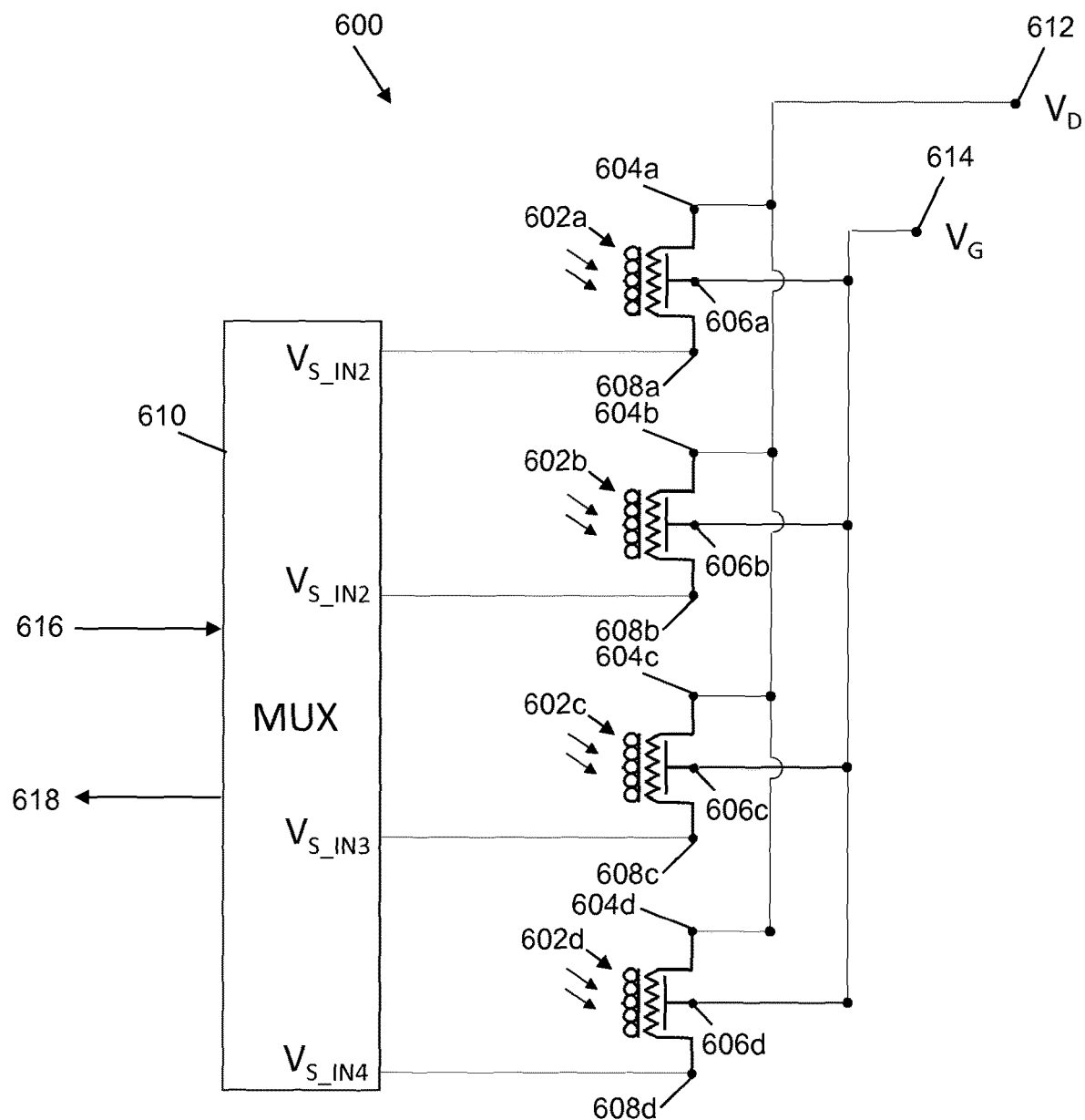
FIG. 6 shows a parallel array of photodetectors according to examples described herein.

FIG. 6 illustrates an example array 600 of photodetectors 602a-d which may be used with apparatus described herein. FIG. 6 may be considered to be a parallel photodetector array configured to provide the photodetector output signals as current signals. The photodetectors 602a-d in this example are field-effect transistors, and may be quantum dot graphene field-effect transistors (QD GFETs). Each photodetector 602a-d in the array 600 of photodetectors in this example comprises a channel (not shown), and for the case of QD GFETs the channel comprises graphene. Each photodetector 602a-d also comprises source electrodes 608a-d and drain electrodes 604a-d configured to enable a flow of electrical current through the channel between the source and drain electrodes 608a-d, 604a-d. Further, each photodetector 602a-d comprises a photosensitiser 610a-d (such as a plurality of quantum dots as a quantum dot layer) configured to generate electron-hole pairs on exposure to incident electromagnetic radiation to produce a detectable change in the electrical current flowing through the channel. The detectable change in electrical current constitutes the image component of the photodetector output signal.

The source electrodes 608a-d of the photodetectors 602a-d are each connected to respective inputs $V_{S\_IN1-4}$ of a multiplexer 620 to allow readout of the photodetector output signals. The drain electrodes 604a-d of the photodetectors 602a-d in this example are connected in parallel to a common drain voltage source $V_D$ 612 and may thus be biased with a common drain voltage. Each photodetector 602a-d in this example also comprises a gate electrode 606a-d configured to enable the flow of electrical current to be varied. The gate electrode 606a-d of each photodetector 602a-d in this example is connected in parallel to the gate electrodes 606a-d of the other photodetectors in the array and to a common gate voltage source $V_G$ 614. The photodetectors 602a-d may be arranged to form a one, two or three dimensional array.

QD GFET photosensors may be well-suited for measurements using apparatus as described herein, because a QD GFET is a photoconductor where the quantum dots gate the GFET, and the charges trapped in the quantum dots have a long trap lifetime. This means that the GFET channel can be measured many times successively without the measurement event having a significant effect on the sensor state. In other words, measuring the QD GFET sensor does not discharge or "reset" the sensor, thus allowing for multiple successive measurement readings to be taken.

An alternative configuration of photodetectors is shown in FIG. 7, in which the photodetectors 702a-d of the array are arranged to form half-bridge circuits 750, 760 configured to convert photodetector output signals into single-ended voltage signals 752, 762 which are output to a multiplexer $V_{S\_IN1-2}$. The photodetectors in this example are again FETs.

Each half bridge circuit 750, 760 comprises two FETs 702a-b; 702c-d. In this example, in each half-bridge 750, 760, the two FETs 702a-b; 702c-d are oppositely biased. Since the first FET 702a, 702c exhibits an opposite response to the second FET 702b, 702d, the output signal of the half-bridge 750, 760 can be up to twice as large as a similar half-bridge circuit which is not used with oppositely biased FET (e.g., having one FET and one resistor instead of two FETs).

In this example, FETs biased in a first sense 702a, 702c have gate electrodes 706a, 706c which are connected to a common first gate terminal $V_{GG1}$ 714a. FETs biased in a second sense 702b, 702d opposite to the first sense have gate electrodes 706b, 706d which are connected to a common second gate terminal $V_{GG2}$ 714b. That is, $V_{GG1}$ 714a and $V_{GG2}$ 714b correspond to oppositely biased FETs so that as $V_{GG1}$ 714a applies a gate voltage of a first magnitude to the first FETs 702a, 702c, $V_{GG2}$ 714b may apply an equal and opposite gate voltage to the second FETs 702b, 702d. In other examples $V_{GG1}$ 814a and $V_{GG2}$ 814b need not necessarily be equal and opposite.

The drain voltage connection of each bridge 750, 760 (in this case from drain electrodes 708a and 708c) is connected to a shared drain voltage source VDD 712. However, in a bridge array configuration, it is not the drain currents which are measured (as in the array of FIGS. 3 and 6) but instead the output voltage of each bridge 750, 760. Therefore the bridge outputs 752, 762 are connected to the multiplexer MUX 710. The source electrode 704a of the first FET 702a and the drain electrode 708b of the second FET 702b of the first half-bridge circuit 750 are connected together at the bridge output 752 and to the MUX input $V_{S\_IN1}$. The source electrode 704c of the first FET 702c and the drain electrode 708d of the second FET 702d of the second half-bridge circuit 760 are connected together at the bridge output 762 and to the MUX input $V_{S\_IN2}$.

The ground connection of each bridge 750, 760 is connected to a shared circuit ground GND, as these are simply sinking the current. The source electrode 704b of the second FET 702b of the first half-bridge circuit 750, and the source electrode 704d of the second FET 702d of the second half-bridge circuit 760 are connected to ground GND.

A further alternative configuration of photodetectors is shown in FIG. 8, in which the photodetectors 802a-h of the array are arranged to form full-bridge circuits 850, 860 configured to convert photodetector output signals into differential voltage. Using a full-bridge configuration can provide a differential output signal which may help to eliminate many signal disturbances, such as those arising from the supply voltage and external disturbances. Again, the photodetectors in this example are FETs. Connections between the source and drain electrodes of the FETs 802a-h are similar to those shown in FIG. 7.

The gate electrode 806a-h of each FET 802a-h is connected in parallel to the gate electrodes 806a-h of the other FETs in the array 800. In this example, FETs biased in a first sense 802a, 802c, 802e, 802g have gate electrodes 806a, 806c, 806e, 806g which are connected to a common first gate terminal $V_{GG1}$ 814a. FETs biased in a second sense 802b, 802d, 802f, 802h opposite to the first sense have gate electrodes 806b, 806d, 806f, 806h which are connected to a common second gate terminal $V_{GG2}$ 814b. That is, $V_{GG1}$ 814a and $V_{GG2}$ 814b correspond to oppositely biased FETs so that as $V_{GG1}$ 814a applies a gate voltage of a first magnitude to the first FETs 802a, 802c, 802e, 802g, $V_{GG2}$ 814b may in some examples apply an equal and opposite gate voltage to the second FETs 802b, 802d, 802f, 802h.

In this example there are two multiplexers (not shown)—one for the VN outputs 852, 856 and one for the VP outputs 854, 858 of the full bridge circuits 850, 860. Other output configurations are possible. The source electrode of the first FET 802a and the drain electrode of the second FET 802b of the first full-bridge circuit 850 are connected together at VN 852 and to the N-MUX input $V_{S\_IN1\_N}$. The drain electrode of the third FET 802c and the source electrode of the fourth FET 802d of the first full-bridge circuit 850 are connected together at VP 854 and to the P-MUX input $V_{S\_IN1\_P}$. The source electrode of the first FET 802e and the drain electrode of the second FET 802f of the second half-bridge circuit 860 are connected together at VN 856 and to the N-MUX input $V_{S\_IN2\_N}$. The drain electrode of the third FET 802g and the source electrode of the fourth FET 802h of the second half-bridge circuit 860 are connected together at VP 858 and to the P-MUX input $V_{S\_IN2\_P}$.

In examples using QD GFETs as photodetectors, one or more of the material, size and shape of such quantum dots may be configured such that the electron-hole pairs are generated on exposure to at least one of the following types of electromagnetic radiation: x-rays, visible light, infrared, ultraviolet, radio waves, microwaves, gamma rays and thermal radiation. Such quantum dots may comprise one or more of PbS, CdSe, CdS, PbSe, ZnO, ZnS, CZTS, $Cu_2S$, $Bi_2S_3$, $Ag_2S$, $Ag_2S$, HgTe, CdHgTe, InAs, InSb, Ge and CIS.

In certain example apparatus, FET photodetector arrays may be used in which the channel comprises graphene (as GFETs_). Graphene exhibits a relatively high charge carrier mobility which is particularly sensitive to the electric field generated by the gate electrode(s) (and in the case of photosensitive functionalisation of the FET, sensitive to the photosensitiser material). In other examples, however, the channel member(s) may comprise different two-dimensional materials such as a graphene-like material (e.g. graphene oxide, phosphorene, silicone, germanene, stanine, h-BN, AlN, GaN, InN, InP, InAs, BP, BaS or GaP) or a transition metal dichalcogenide (e.g. $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ or $PtX_2$, where X=S, Se or Te).

Throughout this specification in relation to FET photodetectors, the terms "source electrode" and "drain electrode" are used to denote electrodes at opposing sides of a channel between which charge can flow. In some examples, for example where the FETs are quantum-dot graphene FETs (QD GFETs), such devices may be described as ambipolar. The charge carriers in such an apparatus may be electrons or holes depending on, for example, back gating or chemical doping of the channel layer, and the types of charge carriers can change in use depending on how the apparatus is being used. In some examples it may be taken that the electrode labelled as the source electrode is at a lower voltage than the electrode labelled as the drain electrode.

Apparatus described herein may be able to provide faster image acquisition and formation than apparatus which measure the output of each photodetector of an array individually if using fewer measurements than there are photodetectors in the array. A greater photodetector-to-photodetector resistance/dark current variation may be tolerated and acceptable quality images still recorded using apparatus described herein, because the read-out amplification is set for the combined output of a number of photodetectors rather than for each individual photodetector. The dynamic range of the ADC or other components in read-out circuitry is not limited by the variations in photodetector resistance/dark current levels because the apparatus are configured to measure from subsets of photodetectors which have substantially the same combined dark current components of their respective output signals. QD GFET sensors may be well-suited for the measurement schemes discussed herein because they can be repetitively measured without discharging/resetting the sensor.

FIG. 9 shows another example of the present apparatus 914. The apparatus 914 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, an electromagnetic radiation sensor, an optical imaging device, an infrared imaging device, an X-ray imaging device, a biometric identification device, and a module for one or more of the same.

In the example shown, the apparatus 914 comprises various components as described previously (denoted collectively by reference numeral 915), an ammeter 916, a voltmeter 917, a power supply 918, a processor 919 and a storage medium 920, which are electrically connected to one another by a data bus 921.

The processor 919 is configured for general operation of the apparatus 914 by providing signalling to, and receiving signalling from, the other components to manage their operation. The storage medium 920 is configured to store computer code configured to perform, control or enable operation of the apparatus 914. The storage medium 920 may also be configured to store settings for the other components (for example, it may store a sensing matrix). The processor 919 may access the storage medium 920 to retrieve the component settings in order to manage the operation of the other components.

Under the control of the processor 919, the power supply 918 may be configured to apply a voltage between the source and drain electrodes of FET photodetectors in the array to enable a flow of electrical current through the respective FET channels. In addition, the power supply 918 may be configured to apply a further voltage to the gate electrode to control the movement of charge carriers in the channel of a particular FET. For non-FET-based photodetectors, the power supply 918 may power these photodetectors.

The ammeter 916 may be configured to measure the electrical current through the channels of the FET photodetectors so that any changes in current, for example caused by external stimuli such as electromagnetic radiation, can be determined. Additionally or alternatively, a voltmeter 917 may be configured to measure the voltage signal corresponding to a change in electrical current (for example, if the photodetectors are arranged in half or full bridge circuits such as those of FIGS. 7 and 8).

The processor 919 may be a microprocessor, including an Application Specific Integrated Circuit (ASIC). The storage medium 920 may be a temporary storage medium such as a volatile random access memory. The storage medium 920 may be a permanent storage medium such as a hard disk drive, a flash memory, or a non-volatile random access memory. The power supply 918 may comprise one or more of a primary battery, a secondary battery, a capacitor, a supercapacitor and a battery-capacitor hybrid.

FIG. 10 shows a method 1000 illustrating schematically the main steps 1002, 1004 of identifying a plurality of subsets of photodetectors from the array for signal readout and amplification by a readout circuit based on a predetermined dark current component for each photodetector in an array of photodetectors, each photodetector of the array configured to provide a photodetector output signal comprising the dark current component and an image component on exposure to incident electromagnetic radiation from a target scene, wherein each subset of photodetectors is identified such that the combined dark current component of the constituent photodetector output signals for each subset is substantially the same 1002; and providing the identified plurality of subsets for use in signal readout and amplification by the readout circuit 1004.

Figure 11:
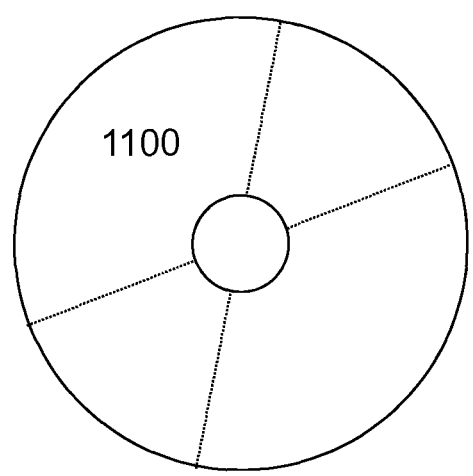
FIG. 11 shows a computer-readable medium comprising a computer program configured to perform, control or enable a method described herein.

FIG. 11 illustrates schematically a computer/processor readable medium 1100 providing a program according to an example. In this example, the computer/processor readable medium is a disc such as a digital versatile disc (DVD) or a compact disc (CD). In some examples, the computer readable medium may be any medium that has been programmed in such a way as to carry out an inventive function. The computer program code may be distributed between the multiple memories of the same type, or multiple memories of a different type, such as ROM, RAM, flash, hard disk, solid state, etc.

Examples depicted in the figures have been provided with reference numerals that generally correspond to similar features of earlier described examples. For example, feature number 1 can also correspond to numbers 101, 201, 301 etc. These numbered features may appear in the figures but may not have been directly referred to within the description of these particular examples. These have still been provided in the figures to aid understanding of the further examples, particularly in relation to the features of similar earlier described examples.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some examples, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such examples can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some examples one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc.), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/examples may consist of any such individual feature or combination of features. In view of the foregoing description it will be evident to a person skilled in the art that various modifications may be made within the scope of the disclosure.

While there have been shown and described and pointed out fundamental novel features as applied to different examples thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or example may be incorporated in any other disclosed or described or suggested form or example as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising:
   at least one processor; and
   at least one memory including computer program code;
   the at least one memory and the computer program code configured to, with the at least one processor, cause the apparatus at least to perform:
   based on a dark current component for each photodetector in an array of photodetectors, identify a plurality of subsets of photodetectors from the array for signal readout and amplification by a readout circuit, each photodetector of the array configured to provide a photodetector output signal comprising the dark current component and an image component on exposure to incident electromagnetic radiation from a target scene, wherein each subset of photodetectors is identified such that the combined dark current component of the constituent photodetector output signals for each subset is the same; and
   provide the identified plurality of subsets for use in signal readout and amplification by the readout circuit.

2. The apparatus of claim 1, wherein each subset of photodetectors is identified such that the combined dark current component of the constituent photodetector output signals for each subset is one of:
   at a predefined level which is matched to a predefined readout circuit offset level; or
   subtracted from a combined photodetector output signal for each subset,
   the combined photodetector output signal comprising the combined dark current component and a combined image component for each subset, to obtain the combined image component for each subset.

3. The apparatus of claim 1, wherein the identification of photodetectors for each subset is performed using a Bernoulli distribution such that the combined dark current components of the constituent photodetector output signals for the plurality of subsets are the same regardless of the number of photodetectors in each subset.

4. The apparatus of claim 1, wherein the number of subsets is one of: less than the number of photodetector, or greater than the number of photodetectors in the array.

5. The apparatus of claim 1, wherein the array of photodetectors forms a tile of a plurality of tiles, and each of the plurality of tiles are coupled to a respective read-out circuit; and wherein the at least one memory and the computer program code are further configured to, with the at least one processor, cause the apparatus at least to: provide the respective combined image components for each subset of photodetectors of the tile for subsequent combination with the respective combined image components for each subset of photodetectors of the other tiles to form the image of the target scene.

6. The apparatus of claim 1, wherein the at least one memory and the computer program code are further configured to, with the at least one processor, cause the apparatus at least to provide the respective combined image component for each subset of photodetectors for use in signal read-out and amplification by the readout circuit by controlling a multiplexer according to the identification of photodetectors of that subset.

7. The apparatus of claim 1, wherein the apparatus comprises the read-out circuit, and wherein the read-out circuit comprises: a multiplexer configured to select the photodetectors of each the plurality of subsets of photodetectors according to the identification of photodetectors of each subset for signal read-out and amplification.

8. The apparatus of claim 1, wherein the apparatus further comprises the read-out circuit, and wherein the read-out circuit comprises: a summer configured to, for each of the plurality of subsets of photodetectors, receive the photodetector output signals from each of the photodetectors of a subset, and sum at least the image components of the received photodetector output signals to provide a combined image component for the subset of photodetectors.

9. The apparatus of claim 1, wherein the apparatus comprises the read-out circuit, and wherein the read-out circuit comprises:
an analog-to-digital converter configured to: receive at least the combined image components for each of the plurality of subsets of photodetectors; convert the received combined image components to a digital combined image component signal, and provide the digital combined image component signal, the digital combined image component signal useable to form an image of the target scene.

10. The apparatus of claim 1, wherein the at least one memory and the computer program code are further configured to, with the at least one processor, cause the apparatus at least to:
receive, after signal readout and amplification, the amplified combined image component for each subset of photodetectors; and
process the received amplified combined image component for each subset of photodetectors to form an image of the target scene.

11. The apparatus of claim 1, wherein each subset of photodetectors comprises one or a plurality of photodetectors.

12. The apparatus of claim 1, wherein each photodetector in the array of photodetectors comprises: a channel; source and drain electrodes configured to enable a flow of electrical current through the channel between the source and drain electrodes; and a photosensitiser configured to generate electron-hole pairs on exposure to incident electromagnetic radiation to produce a detectable change in the electrical current flowing through the channel, the detectable change in electrical current constituting the image component of the photodetector output signal.

13. The apparatus of claim 1, wherein the identification of photodetectors for each subset is one or more of: stored in a look-up table; stored in a shift register; or determined dynamically based on the predetermined dark current components of the constituent photodetector output signals.

14. A method comprising:
identifying a plurality of subsets of photodetectors for signal readout and amplification by a readout circuit based on a predetermined dark current component for each photodetector in an array of photodetectors, each photodetector of the array configured to provide a photodetector output signal comprising the dark current component and an image component on exposure to incident electromagnetic radiation from a target scene, wherein each subset of photodetectors is identified such that the combined dark current component of the constituent photodetector output signals for each subset is the same; and
providing the identified plurality of subsets for use in signal readout and amplification by the readout circuit.

15. The method of claim 14, wherein each subset of photodetectors is identified such that the combined dark current component of the constituent photodetector output signals for each subset is one of:
at a predefined level which is matched to a predefined readout circuit offset level; or
subtracted from a combined photodetector output signal for each subset,
the combined photodetector output signal comprising the combined dark current component and a combined image component for each subset, to obtain the combined image component for each subset.

16. The method of claim 14, wherein the identification of photodetectors for each subset is performed using a Bernoulli distribution such that the combined dark current components of the constituent photodetector output signals for the plurality of subsets are the same regardless of the number of photodetectors in each subset.

17. The method of claim 14, wherein the number of subsets is one of: less than the number of photodetector, and greater than the number of photodetectors in the array.

18. The method of claim 14, wherein the array of photodetectors forms a tile of a plurality of tiles, and each of the plurality of tiles are coupled to a respective read-out circuit; and
wherein the method further comprises: providing the respective combined image components for each subset of photodetectors of the tile for subsequent combination with the respective combined image components for each subset of photodetectors of the other tiles to form the image of the target scene.

19. The method of claim 14, comprising providing the respective combined image component for each subset of photodetectors for use in signal read-out and amplification by the readout circuit by controlling a multiplexer according to the identification of photodetectors of that subset.

20. A non-transitory computer readable medium comprising program instructions stored thereon for performing at least the following:
identifying a plurality of subsets of photodetectors for signal readout and amplification by a readout circuit based on a predetermined dark current component for each photodetector in an array of photodetectors, each photodetector of the array configured to provide a photodetector output signal comprising the dark current component and an image component on exposure to incident electromagnetic radiation from a target scene, wherein each subset of photodetectors is identified such that the combined dark current component of the constituent photodetector output signals for each subset is the same; and providing the identified plurality of subsets for use in signal readout and amplification by the readout circuit.

* * * * *